(12) United States Patent
Kim et al.

(10) Patent No.: US 9,525,047 B2
(45) Date of Patent: Dec. 20, 2016

(54) THIN-FILM TRANSISTOR SUBSTRATE, METHOD OF MANUFACTURING SAME, AND ORGANIC LIGHT-EMITTING DISPLAY APPARATUS INCLUDING THIN-FILM TRANSISTOR SUBSTRATE

(71) Applicant: Samsung Display Co., Ltd., Yongin, Gyeonggi-Do (KR)

(72) Inventors: Kwang-Hae Kim, Yongin (KR); Jae-Beom Choi, Yongin (KR); Kwan-Wook Jung, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/793,533

(22) Filed: Jul. 7, 2015

(65) Prior Publication Data
US 2015/0311318 A1    Oct. 29, 2015

Related U.S. Application Data

(62) Division of application No. 14/067,230, filed on Oct. 30, 2013, now Pat. No. 9,105,529.

(30) Foreign Application Priority Data

May 23, 2013  (KR) .......................... 10-2013-0058547

(51) Int. Cl.
*H01L 29/66* (2006.01)
*H01L 27/12* (2006.01)
(Continued)

(52) U.S. Cl.
CPC ... *H01L 29/66765* (2013.01); *H01L 21/02107* (2013.01); *H01L 21/02365* (2013.01);
(Continued)

(58) Field of Classification Search
CPC .................................................. H01L 27/3248
See application file for complete search history.

(56) References Cited

U.S. PATENT DOCUMENTS 8,354,669 B2   1/2013  No et al.
8,445,915 B2   5/2013  You
(Continued)

FOREIGN PATENT DOCUMENTS

KR   2003-0057018    7/2003
KR   10-2012-0004785  1/2012
KR   10-2012-0066492  6/2012

*Primary Examiner* — Marc Armand
(74) *Attorney, Agent, or Firm* — Knobbe, Martens, Olson & Bear LLP (57) ABSTRACT

A thin film transistor (TFT) substrate, an organic light-emitting display apparatus including the TFT substrate, and a method of manufacturing the TFT substrate that enable simple manufacturing processes and a decrease in the interference between a capacitor and other interconnections are disclosed. The TFT substrate may include a substrate, a TFT arranged on the substrate, the TFT including an active layer, a gate electrode, a source electrode, and a drain electrode, a pixel electrode electrically connected to one of the source electrode and the drain electrode, and a capacitor including a lower capacitor electrode and an upper capacitor electrode, the lower capacitor electrode formed from the same material as the active layer and arranged on the same layer as the active layer, and the upper capacitor electrode formed from the same material as the pixel electrode.

9 Claims, 5 Drawing Sheets

(51) Int. Cl.

| | | |
|---|---|---|
| *H01L 27/32* | (2006.01) | |
| *H01L 21/02* | (2006.01) | |
| *H01L 21/283* | (2006.01) | |
| *H01L 21/306* | (2006.01) | |
| *H01L 21/311* | (2006.01) | |
| *H01L 21/3213* | (2006.01) | |
| *H01L 21/3215* | (2006.01) | |

(52) U.S. Cl.
CPC ...... *H01L 21/283* (2013.01); *H01L 21/30604* (2013.01); *H01L 21/31111* (2013.01); *H01L 21/3215* (2013.01); *H01L 21/32133* (2013.01); *H01L 27/124* (2013.01); *H01L 27/127* (2013.01); *H01L 27/1248* (2013.01); *H01L 27/1255* (2013.01); *H01L 27/1288* (2013.01); *H01L 27/3244* (2013.01); *H01L 27/3248* (2013.01); *H01L 27/3265* (2013.01); *H01L 29/66772* (2013.01); *H01L 27/3262* (2013.01); *H01L 2227/323* (2013.01)

(56) References Cited

U.S. PATENT DOCUMENTS

| | | | |
|---|---|---|---|
| 8,637,868 B2 | 1/2014 | Choi et al. | |
| 8,698,147 B2 | 4/2014 | Choi et al. | |
| 8,796,768 B2 | 8/2014 | You | |
| 2003/0137255 A1 | 7/2003 | Park et al. | |
| 2010/0193790 A1 | 8/2010 | Yeo et al. | |
| 2012/0007083 A1 | 1/2012 | You et al. | |
| 2012/0074414 A1 | 3/2012 | Lee et al. | |
| 2012/0146030 A1 | 6/2012 | You et al. | |
| 2013/0015456 A1 | 1/2013 | You | |
| 2013/0037812 A1* | 2/2013 | Park | H01L 27/3248 257/59 |
| 2013/0037828 A1 | 2/2013 | Moon et al. | |
| 2013/0119387 A1 | 5/2013 | Park et al. | |
| 2013/0134423 A1 | 5/2013 | Jin et al. | |
| 2013/0146878 A1 | 6/2013 | Oh et al. | |
| 2013/0153914 A1 | 6/2013 | You et al. | |
| 2013/0200379 A1 | 8/2013 | You et al. | |
| 2013/0228786 A1 | 9/2013 | Park | |
| 2013/0293236 A1 | 11/2013 | Lee et al. | |
| 2013/0306938 A1 | 11/2013 | Lee et al. | |
| 2013/0306939 A1 | 11/2013 | Park et al. | |
| 2014/0014913 A1 | 1/2014 | Lee | |
| 2014/0042394 A1 | 2/2014 | Lee | |
| 2014/0124746 A1 | 5/2014 | Hwang | |

* cited by examiner

THIN-FILM TRANSISTOR SUBSTRATE, METHOD OF MANUFACTURING SAME, AND ORGANIC LIGHT-EMITTING DISPLAY APPARATUS INCLUDING THIN-FILM TRANSISTOR SUBSTRATE

CROSS-REFERENCE TO RELATED APPLICATIONS

This application is a divisional application of U.S. patent application Ser. No. 14/067,230 filed Oct. 30, 2013, now pending, which claims the benefit of Korean Patent Application No. 10-2013-0058547, filed on May 23, 2013, in the Korean Intellectual Property Office, the disclosure of each of which is incorporated herein in its entirety by reference.

BACKGROUND

Field

The present disclosure relates to a thin film transistor (TFT) substrate, an organic light-emitting display apparatus including the TFT substrate, and a method of manufacturing the TFT substrate, and more particularly, to a thin film transistor (TFT) substrate that decreases interference between a capacitor and other interconnections and a simplified manufacturing method.

Description of the Related Technology

Among display apparatuses, an organic light-emitting display apparatus is receiving attention as a next-generation display apparatus because it has wide viewing angles, excellent contrast, and high response speeds. The organic light-emitting display apparatus has a thin film transistor (TFT) substrate that includes TFTs, a capacitor, and interconnections that electrically connect them. TFTs, capacitor, and interconnections are often manufactured with a photolithography process using a patterned mask.

SUMMARY OF CERTAIN INVENTIVE ASPECTS

In one aspect, a method of manufacturing such a typical thin film transistor (TFT) array substrate is provided. The method includes, for example, using a mask having a desired pattern. As the number of processes of using a mask increases, the cost of manufacturing also increases. In addition, use of a mask may also complicate manufacture. More complex manufacture increases manufacturing time and manufacturing cost. Moreover, adding a mask when forming a capacitor or in forming interconnections with specific width may be limited.

In another aspect, the present disclosure a TFT array substrate is provided.

In another aspect, an organic light-emitting display apparatus including a TFT array substrate is provided.

In another aspect, a method of manufacturing a TFT array substrate is provided. The method may include, for example, a simplified manufacturing process and decreased interference between a capacitor and other interconnections.

A thin film transistor (TFT) substrate may include, for example, a substrate, a TFT formed on the substrate, the TFT including an active layer, a gate electrode, a source electrode, and a drain electrode, a pixel electrode connected electrically to one of the source electrode and the drain electrode, and a capacitor having a lower capacitor electrode and an upper capacitor electrode, the lower capacitor electrode formed from the same material as the active layer and arranged on the same layer as the active layer, and the upper capacitor electrode formed from the same material as the pixel electrode.

In some embodiments, the TFT substrate further includes, for example, a first insulating layer formed between the active layer and the gate electrode and between the lower capacitor electrode and the upper capacitor electrode, and a second insulating layer formed between the source electrode and the gate electrode and between the drain electrode and the gate electrode. In some embodiments, the second insulating layer has a first opening corresponding to the lower capacitor electrode. In some embodiments, the TFT substrate further includes a third insulating layer covering the source electrode and the drain electrode. In some embodiments, the third insulating layer is formed between the second insulating layer and the pixel electrode and has a second opening corresponding to the lower capacitor electrode. In some embodiments, the upper capacitor electrode may cover a part of the first insulating layer exposed by the first opening and the second opening, an internal surface of the first opening, and an internal surface of the second opening. In some embodiments, a part of the upper capacitor electrode may have the same thickness as the pixel electrode. In some embodiments, the part corresponds to the first insulating layer. In some embodiments, the TFT substrate may further include a connection layer arranged on the first insulating layer to be in contact with the upper capacitor electrode. In some embodiments, the connection layer is formed from the same material as the gate electrode. In some embodiments, the connection layer may have a connection opening corresponding to the first opening. In some embodiments, an internal surface of the connection opening and an internal surface of the first opening may have the same internal surface along the first opening. In some embodiments, the upper capacitor electrode may cover a part of the first insulating layer exposed by the first opening, the second opening, and the connection opening, an internal surface of the connection opening, an internal surface of the first opening, and an internal surface of the second opening.

In another aspect, an organic light-emitting display apparatus is provided that includes, for example, a substrate, a thin film transistor (TFT) arranged on the substrate, the TFT including an active layer, a gate electrode, a source electrode, and a drain electrode, a pixel electrode electrically connected to one of the source electrode and the drain electrode, a capacitor including a lower capacitor electrode and an upper capacitor electrode, the lower capacitor electrode formed on the same layer as the active layer and the upper capacitor electrode formed from the same material as the pixel electrode, an intermediate layer arranged on the pixel electrode, and a counter electrode arranged on the intermediate layer.

In another aspect, a method of manufacturing a thin film transistor (TFT) substrate is provided that includes, for example, forming a semiconductor layer on a substrate, patterning the semiconductor layer into an active layer and a lower capacitor electrode, forming a first insulating layer to cover the active layer and the lower capacitor electrode, forming a gate electrode of a TFT and a connection layer of a capacitor on the first insulating layer, forming a second insulating layer with an opening through which a source area and a drain area of the active layer and the connection layer are exposed, forming an temporary layer on the connection layer, a source electrode, and a drain electrode, forming a third insulating layer having an opening through which a part of the source electrode and the temporary layer are exposed, removing a part of the connection layer, and the temporary layer, and forming a pixel electrode electrically connected to one of the source electrode and the drain electrode, and an upper capacitor electrode corresponding to the lower capacitor electrode, on the third insulating layer.

In some embodiments, the forming of the second dielectric layer may include forming the second insulating layer having an opening through which the central part of the top of the connection layer is exposed. In some embodiments, the forming of the third dielectric layer may include forming the third insulating layer having an opening through which the whole top part of the temporary layer is exposed. In some embodiments, the method may further include doping the lower capacitor electrode with an ionic impurity after removing the temporary layer. In some embodiments, the forming of the pixel electrode and the upper capacitor electrode may include simultaneously forming the pixel electrode and the upper capacitor electrode. In some embodiments, the forming of the upper capacitor electrode may include forming the upper capacitor electrode such that it is in contact with the connection layer. In some embodiments, the forming of the upper capacitor electrode may include forming the upper capacitor electrode to face the lower capacitor electrode and to be in contact with internal sides of the opening of the second insulating layer and the opening of the third insulating layer. In some embodiments, the forming of the pixel electrode and the upper capacitor electrode may include simultaneously forming the pixel electrode and the upper capacitor electrode. In some embodiments, the forming of the capacitor may include forming the connection layer to face a part of the lower capacitor electrode.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments can have several aspects, no single one of which necessarily is solely responsible for the desirable attributes of the apparatus, system or method. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

As used herein, the term "and/or" includes any and all combinations of one or more of the associated listed items. Expressions such as "at least one of," when preceding a list of elements, modify the entire list of elements and do not modify the individual elements of the list. Embodiments of the present invention will be described below in detail with reference to the accompanying drawings. The present invention may, however, be embodied in different forms and should not be construed as limited to the embodiments set forth herein. Rather, these embodiments are provided so this disclosure will be thorough and complete, and will fully convey the scope of the present invention to a person of ordinary skill in the art. For convenience of description, the sizes of components may be exaggerated or reduced in the drawing. For example, since the size and thickness of each component in the drawing is arbitrarily represented for convenience of description, the present invention is not limited thereto. When an element such as a layer, a film, area, or a plate is referred to as being "on" another element, it can be directly on said another element or intervening elements may also be present.

FIGS. 1 to 8 are schematic cross-sectional views of a method of manufacturing a thin film transistor (TFT) substrate 1.

Figure 1:
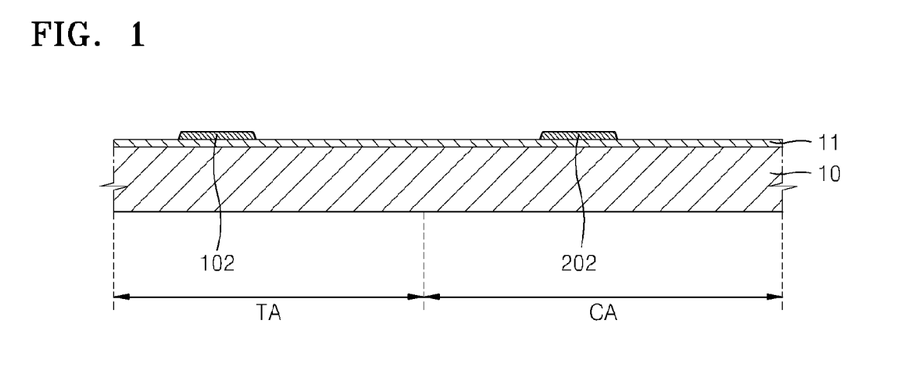
FIG. 1 is a schematic cross-sectional view of a thin film transistor (TFT) array substrate according to an embodiment while manufacturing the substrate.

Referring to FIG. 1, a thin film transistor (TFT) substrate 1 according to an embodiment of the present disclosure has at least a substrate 10 and a buffer layer 11 that is arranged on the substrate 10. The substrate 10 may have a transistor area TA and a capacitor area CA.

The substrate 10 may be a transparent substrate, such as a plastic substrate including polyethylene terephthalate (PET), polyethylene naphthalate (PEN), polyimide, etc., as well as a glass substrate. However, the present disclosure is not limited to only bottom emission. The substrate 10 may be formed of a metal material as needed.

The buffer layer 11 may be further included to form a flat surface on the substrate 10 and block permeation of impure elements into the substrate 10. The buffer layer 11 may be formed as a single layer or a plurality of layers of silicon nitride and/or silicon oxide.

Subsequently, an active layer 102 is formed on the buffer layer 11 on the transistor area TA of the substrate 10. In some embodiments, a lower capacitor electrode 202 is formed on the buffer layer 11 on the capacitor area CA of the substrate 10. In some embodiments, after a silicon layer is formed on the buffer layer 11, the silicon layer may be patterned by using a mask to simultaneously form the active layer 102 and the lower capacitor electrode 202. The active layer 102 and the lower capacitor electrode 202 may be formed of a semiconductor material that includes amorphous silicon or crystalline silicon.

Figure 2:
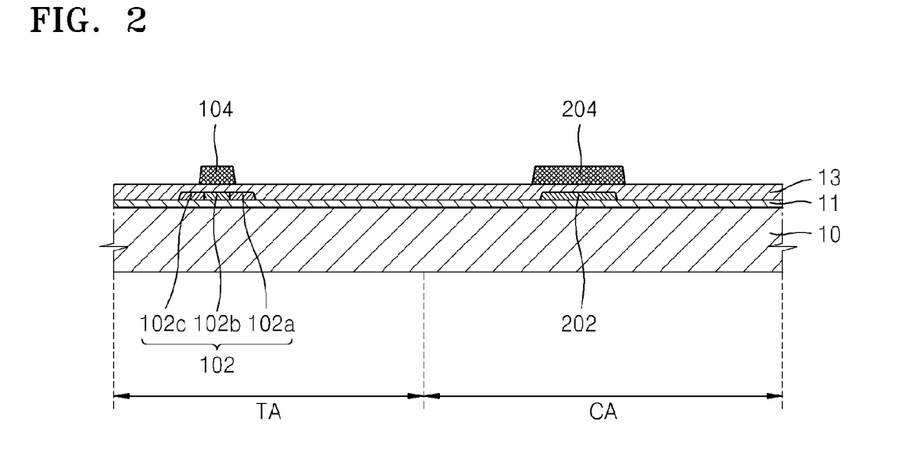
FIG. 2 is a schematic cross-sectional view of the TFT illustrating a portion of the manufacturing process.

As such, after forming the buffer layer 11, and the active layer 102 and lower capacitor electrode 202 of the TFT on the substrate 10, a first insulating layer 13 that is a gate insulating film may be formed, as shown in FIG. 2. The gate insulating film may be formed as an inorganic insulating film that may include $SiO_2$, SiNx, SiON, $Al_2O_3$, $TiO_2$, $Ta_2O_5$, $HfO_2$, $ZrO_2$, BST, PZT, etc.

A gate electrode 104 is formed to correspondingly face a channel area 102b (see FIG. 3) of the active layer 102 on the first insulating layer 13 by using a mask, and a connection layer 204 is formed to correspondingly face the lower capacitor electrode 202 on the first insulating layer 13. As described below, the connection layer 204 may be formed to completely or partially face the lower capacitor electrode 202.

The connection layer 204 may be formed simultaneously with forming the gate electrode 104. That is, after forming a conductive layer on the first insulating layer 13 that is the gate insulating film, the conductive layer 204 may be patterned by using a mask to simultaneously form the gate electrode 104 and the connection layer 204. The connection layer 204 may be formed from the same material as the gate electrode 104 and may be formed in the same thickness as the gate electrode 104.

The gate electrode 104 and the connection layer 204 may be formed as a single layer or a plurality of layer by using one or more metals selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), Molybdenum (Mo), titanium (Ti), tungsten (W), and copper (Cu), for example.

Figure 10:
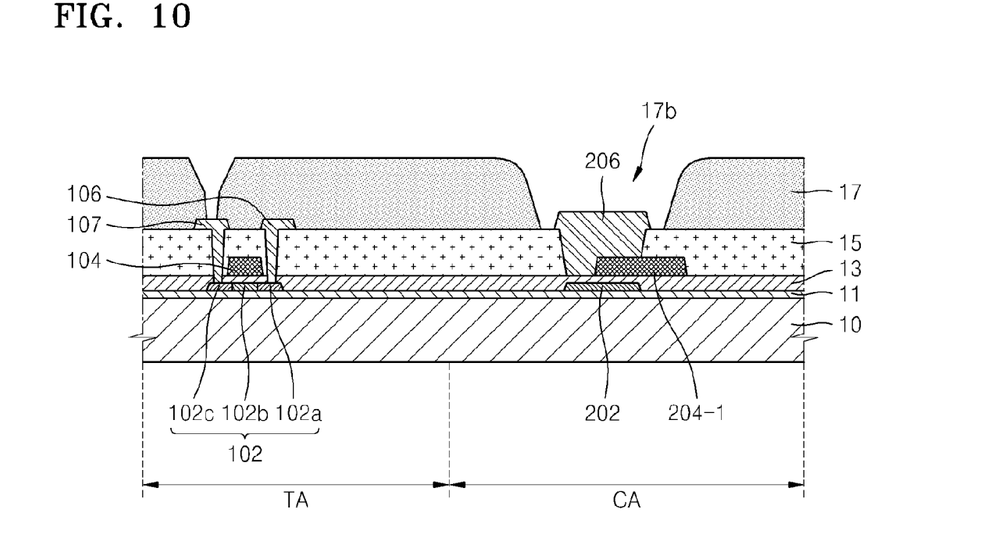
FIG. 10 is a schematic cross-sectional view of a TFT array substrate according to another embodiment of the present disclosure during manufacturing the substrate.
Figure 11:
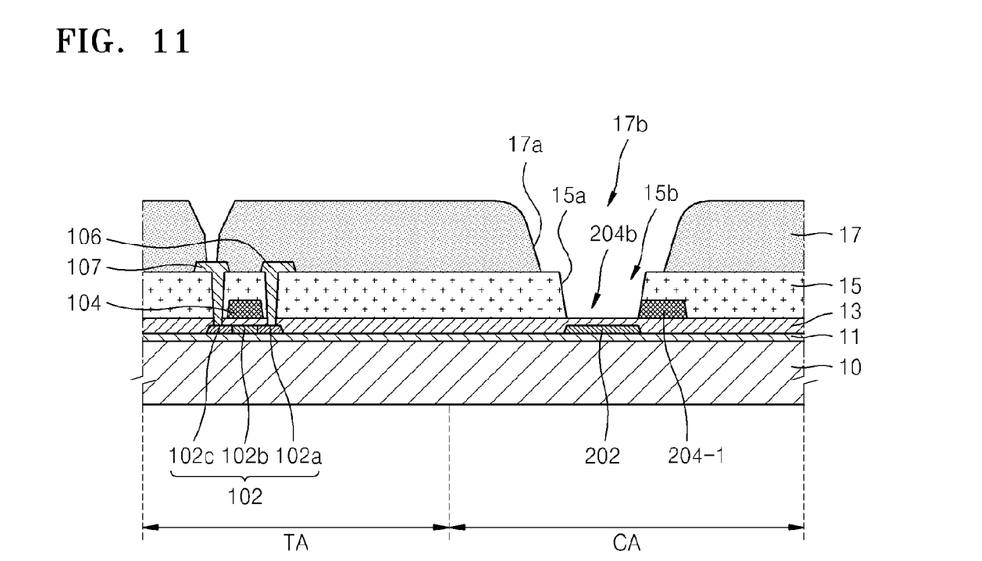
FIG. 11 is a schematic cross-sectional view of a TFT array substrate according to another embodiment of the present disclosure during a manufacturing process.

An upper capacitor electrode 208 is connected to a wiring (not shown) on the connection layer 204 that may be arranged to completely face the lower capacitor electrode 202, as shown in FIGS. 1 to 8. Alternatively, the connection layer 204 may be arranged to partially face the lower capacitor electrode 202, as shown in FIGS. 10 and 11 that schematically show processes related to a method of manufacturing a TFT substrate, according to another embodiment.

Subsequently, a part of the active layer 102, which is not shielded by the gate electrode 104, is doped with an ionic impurity. Through the doping process, a source area 102a connected to a source electrode 106, and a drain area 102c connected to a drain electrode 107 are formed.

Figure 3:
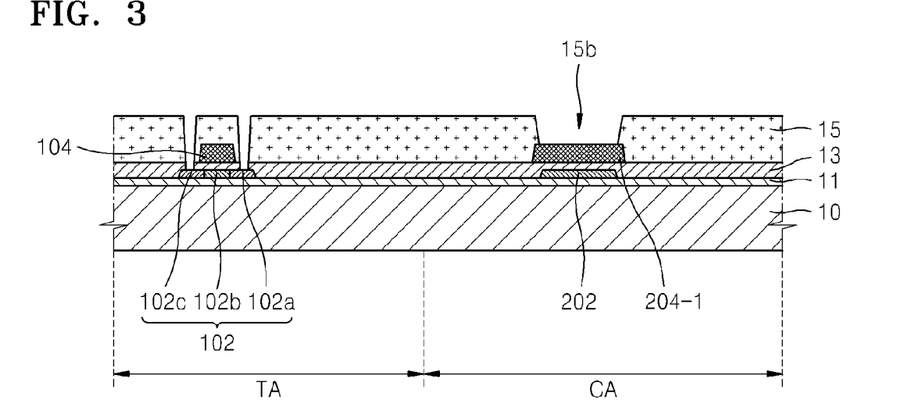
FIG. 3 is a schematic cross-sectional view of the TFT illustrating a portion of the manufacturing process.

Next, a second insulating layer 15 is formed on the first insulating layer 13 to cover the gate electrode 104 and the connection layer 204, as shown in FIG. 3. Subsequently, through a patterning process using a mask, a first opening 15b that exposes the central part of the top of the connection layer 204, and a contact hole that exposes the source area 102a and the drain area 102c are formed.

In this case, as shown in FIG. 3, the second insulating layer 15 may be overlap with both edges of the connection layer 204. That is, the second insulating layer 15 may be formed to cover at least a part of the edges of the connection layer 204. As described below, it is intended so that to a part of the connection layer 204 that is covered with the second insulating layer 15 electrically connects the upper capacitor electrode 208 (see FIG. 8) to an interconnection.

Figure 4:
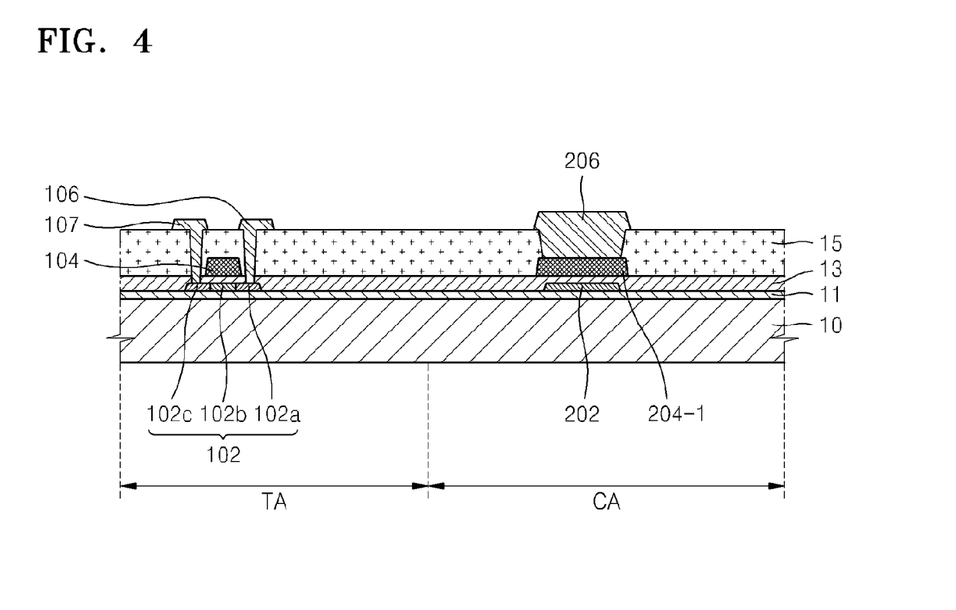
FIG. 4 is a schematic cross-sectional view of the TFT illustrating a portion of the manufacturing process.

After forming the openings in the second insulating layer 15, the source electrode 106, the drain electrode 107, and a temporary layer 206 are formed as shown in FIG. 4. In this case, the source electrode 106 and the drain electrode 107 are respectively connected to the source area 102a and the drain area 102c of the active layer 102 through the contact hole, and the temporary layer 206 is arranged on the connection layer 204.

The temporary layer 206 may be formed simultaneously with the source electrode 106 and the drain electrode 107. That is, after forming a conductive layer on the second insulating layer 15, the conductive layer may be patterned by using a mask to simultaneously form the source electrode 106, the drain electrode 107, and the temporary layer 206. In some embodiments, the metal layer may include a material of the source electrode 106 and the drain electrode 107.

The source electrode 106 and the drain electrode 107 may be formed as a single layer or a plurality of layers by using one or more metals selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), Molybdenum (Mo), titanium (Ti), tungsten (W), and copper (Cu), for example.

Figure 5:
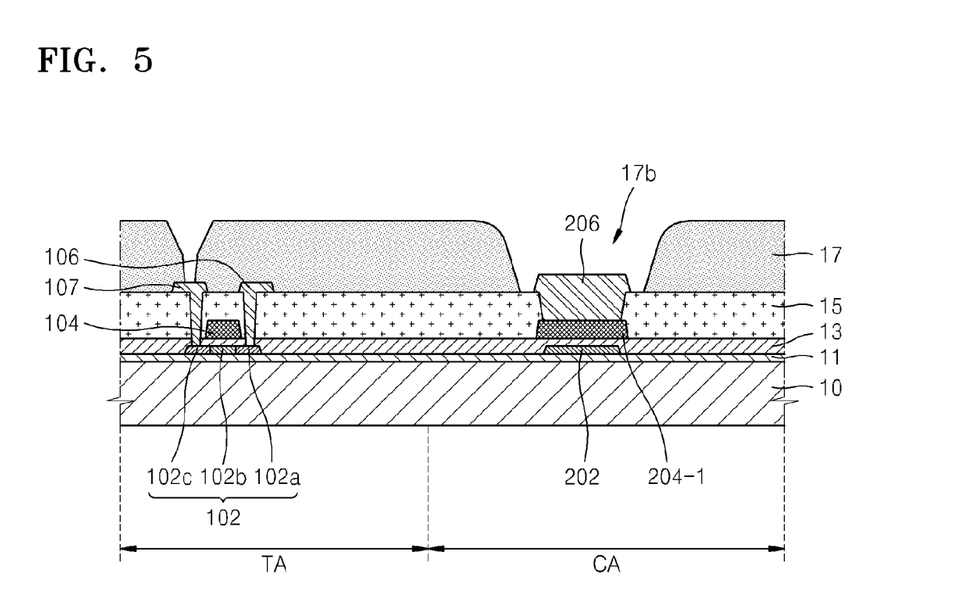
FIG. 5 is a schematic cross-sectional view of the TFT illustrating a portion of the manufacturing process.

Referring to FIG. 5, a third insulating layer 17 is formed on the second insulating layer 15 to cover the source electrode 106 and the drain electrode 107. After forming the third insulating layer 17, a via hole and a second opening 17b are formed by using a mask. In this case, the via hole exposes any one of the source electrode 106 and the drain electrode 107, and the second opening 17b exposes the temporary layer 206.

In the method of manufacturing an organic light-emitting display apparatus according to the embodiment, the second insulating layer 15 and the third insulating layer 17 may be understood as an interlayer insulating film. The second insulating layer 15 and the third insulating layer 17 may be formed as an inorganic insulating film. The second insulating layer 15 and the inorganic insulating film that forms the second insulating layer 15 may include SiO2, SiNx, SiON, Al2O3, TiO2, Ta2O5, HfO2, ZrO2, BST, PZT, etc.

Figure 6:
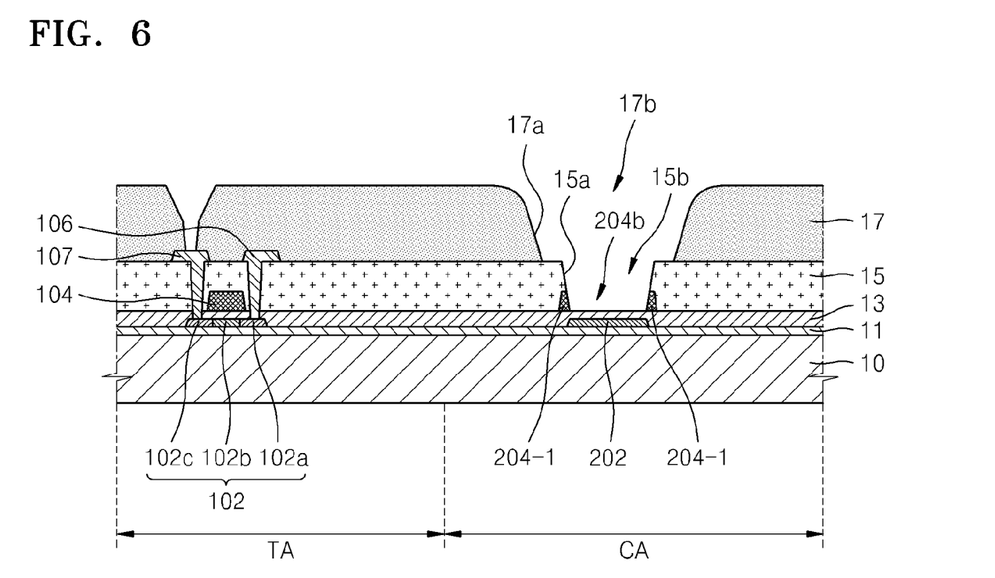
FIG. 6 is a schematic cross-sectional view of the TFT illustrating a portion of the manufacturing process.

Subsequently, as shown FIG. 6, the temporary layer 206 and the connection layer 204 exposed through the second opening 17b formed on the third insulating layer 17 are together etched and thus removed. In this case, a part of the connection layer 204 between the first insulating layer 13 and the temporary layer 206 is etched, which is a part of the connection layer 204 exposed through the first opening 15b of the second insulating layer 15. Thus, at least a part of the connection layer 204 covered with the second insulating layer 15 is not removed and thus remains as a connection section 204-1. That is, it may be understood that the connection section 204-1 has a connection opening 204b that exposes a part of the first insulating layer 13. That is, an internal side 15a of the first opening 15b of the second insulating layer 15 and an internal side 204a of the connection opening 204b of the connection section 204-1 are the same etched surface. The connection section 204-1 may be understood as a part of interconnections that will be electrically connected to the upper capacitor electrode 208 (see FIG. 8).

Figure 7:
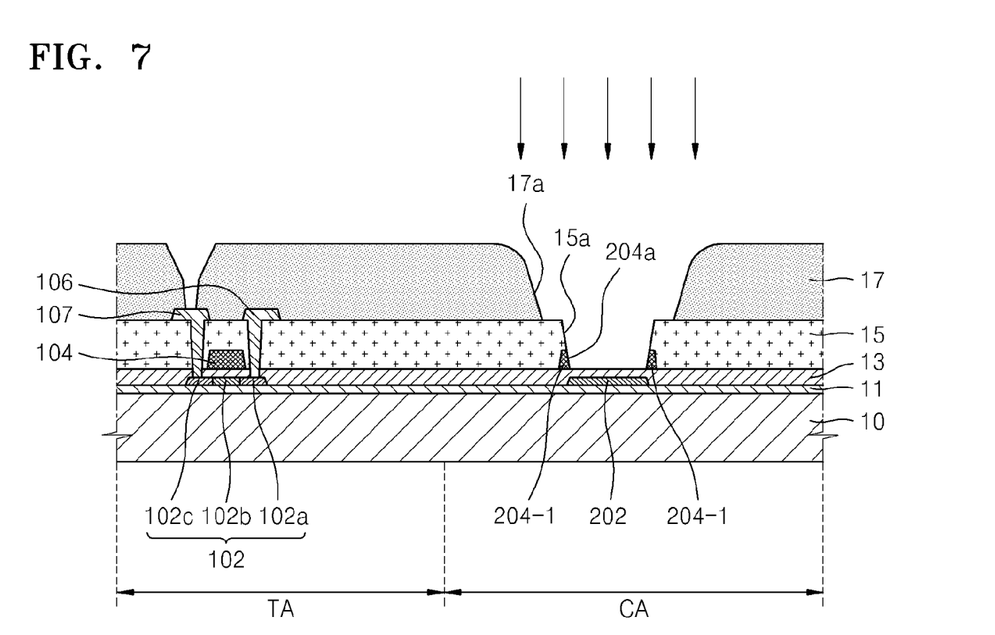
FIG. 7 is a schematic cross-sectional view of the TFT illustrating a portion of the manufacturing process.

As described above, after removing the temporary layer 206 and a part of the connection layer 204, the lower capacitor electrode 202 of the capacitor area CA may be doped with an ionic impurity, as shown in FIG. 7.

Figure 8:
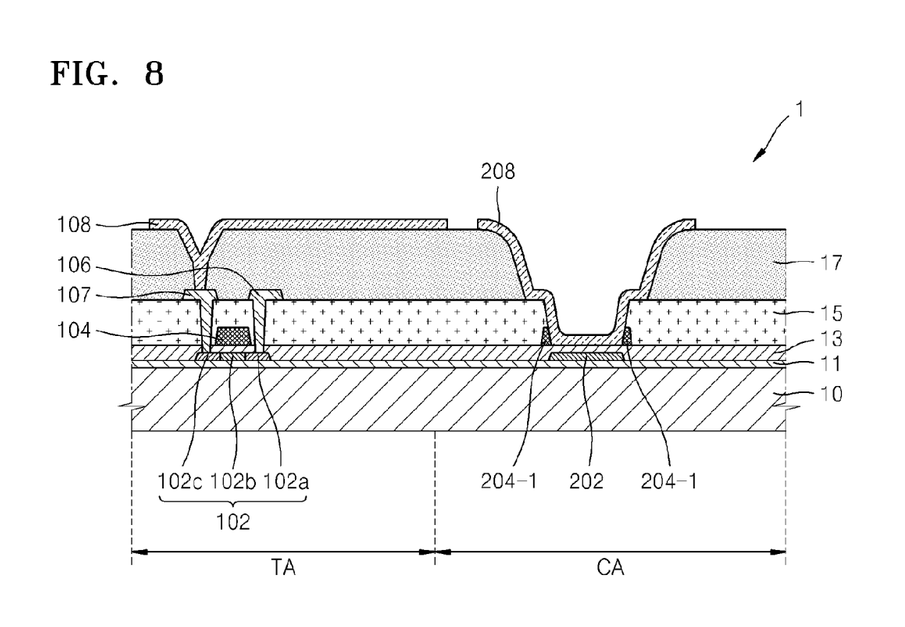
FIG. 8 is a schematic cross-sectional view of the TFT illustrating a portion of the manufacturing process.

Subsequently, as shown in FIG. 8, a conductive layer is formed on the third insulating layer 17 and then patterned by using a mask so a pixel electrode 108 in contact with the source electrode 106 is formed on the third insulating layer 17 of the transistor area TA. In this case, the upper capacitor electrode 208 may be formed simultaneously with the pixel electrode 108 on the capacitor area CA. The upper capacitor electrode 208 will be described below.

Although it is shown that each of the buffer layer 11, the first insulating layer 13, the second insulating layer 15, and the third insulating layer 17 is formed as one layer, the present disclosure is not limited thereto and each of the layers may be formed as a plurality of layers.

The upper capacitor electrode 208 is formed on an internal side 17a of the second opening 17b of the third insulating layer 17, on the internal side 15a of the first opening 15b of the second insulating layer 15, on an internal side 204a of the connection opening 204b of the connection layer 204 remaining on the first insulating layer 13, and on the first insulating layer 13 exposed through the connection opening 204b of the connection layer 204.

As previously described, the pixel electrode 108 and the upper capacitor electrode 208 may be simultaneously formed. Thus, the upper capacitor electrode 208 may be formed from the same material as the pixel electrode 108. In some embodiments, when the pixel electrode 108 and the upper capacitor electrode 208 are simultaneously formed, a part of the upper capacitor electrode 208 on the first insulating layer 13 may have the same thickness as the pixel electrode 108. However, a part of the upper capacitor electrode that covers the connection opening 204b, the first opening 15b, and the second opening 17b may be simultaneously formed but may not have the same thickness as the pixel electrode 108.

The pixel electrode 108 may be a (semi) transparent electrode or reflective electrode. The (semi) transparent electrode may be formed of indium tin oxide (ITO), indium zinc oxide (IZO), zinc oxide (ZnO), indium oxide (In$_2$O$_3$), indium gallium oxide (IGO), or aluminum zinc oxide (AZO), for example. The reflective electrode may include a reflective film formed of a film that is formed of silver (Ag), magnesium (Mg), aluminum (Al), platinum (Pt), palladium (Pd), gold (Au), nickel (Ni), neodymium (Nd), iridium (Ir), chrome (Cr) or a combination thereof, and a film that is formed of tin oxide (ITO), indium zinc oxide (IZO), zinc oxide (ZnO), or indium oxide (In$_2$O$_3$). Of course, the configuration and material of the pixel electrode 108 are not limited thereto and other ones may be used.

According to the method of manufacturing a TFT substrate, according to the embodiment, it is possible to form a capacitor so that interference between the capacitor and other interconnections decreases without using an additional mask.

Figure 9:
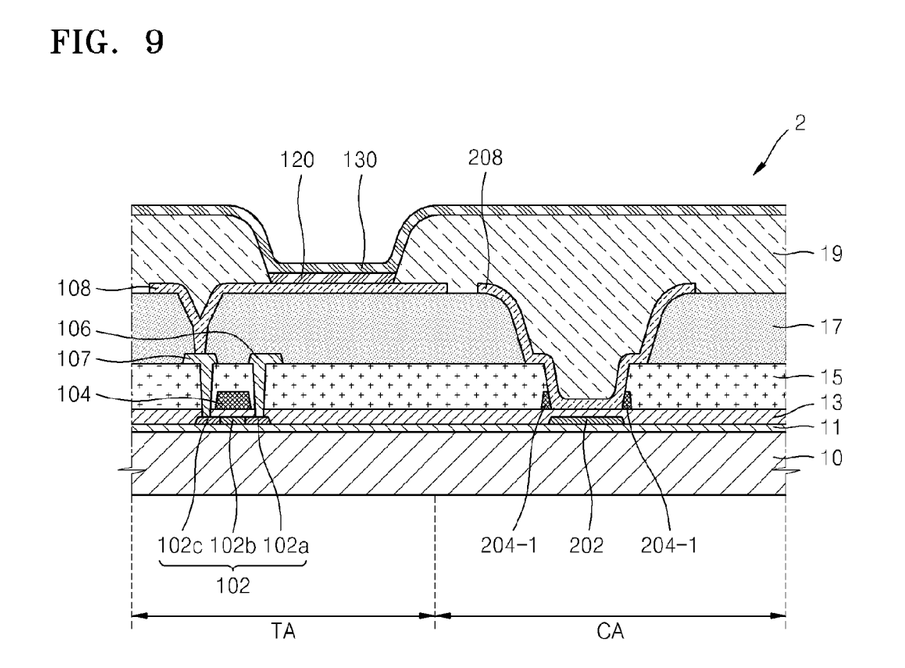
FIG. 9 is a schematic cross-sectional view of an organic light-emitting display apparatus according to an embodiment of the present disclosure.

FIG. 9 is a schematic cross-sectional view of an organic light-emitting display apparatus 2 according to another embodiment of the present disclosure. The organic light-emitting display apparatus 2 according to the embodiment further includes an intermediate layer 120, a counter electrode 130, and a fourth insulating layer 19 functioning as a pixel defining film on the TFT substrate 10. In particular, the organic light-emitting display apparatus 2 according to the embodiment includes the substrate 10, a TFT that is arranged on the substrate 10 and includes the active layer 102, the gate electrode 104, the source electrode 106, and the drain electrode 107, the pixel electrode 108 connected electrically to at least one of the source electrode 106 and the drain electrode 107, a capacitor that includes the lower capacitor electrode 202 arranged on the same layer as the active layer 102, and the upper capacitor electrode 208 that is formed from the same material as the pixel electrode 108, and the counter electrode 130 that is arranged on the intermediate layer 120 that includes an organic emission layer on the pixel electrode 108.

The organic emission layer may be arranged on the pixel electrode 108 of the transistor area TA, and light emitted from the intermediate layer 120 may be emitted to the outside through the pixel electrode 108 and the substrate 10 or through the counter electrode 130.

The fourth insulating layer 19 that may be understood as a pixel defining film has an opening that exposes at least the central part of the pixel electrode 108. Such a pixel defining film may play a role in defining a pixel because it has an opening facing each sub-pixel through which the central part of or a whole part of the pixel electrode 108 is exposed. In some embodiments, the pixel defining film increases the distance between the edge of the pixel electrode 108 and the counter electrode 130 on the pixel electrode 108, and thus, may play a role of preventing the edge of the pixel electrode 108 from experiencing arc.

The fourth insulating layer 19 may be formed as an organic insulating film. The fourth insulating layer 19 may include commercial polymer (such as PMMA, PS), a polymer derivative having a phenol group, acryl-based polymer, imide-based polymer, aryl ether-based polymer, amide-based polymer, fluorine-based polymer, p-xylene-based polymer, vinyl alcohol-based polymer, or a blend thereof.

The intermediate layer 120 may include various layers, some of which may be patterned to be integrated for a plurality of pixels and some of which may be patterned to face each pixel.

The intermediate layer 120 may be a small molecular organic material or a polymeric organic material. When the intermediate layer 120 is formed of the small molecular organic material, a hole transport layer (HTL), a hole injection layer (HIL), an electron transport layer (ETL), and an electron injection layer (EIL) may be stacked around the intermediate layer 120. In some embodiments, various layers may be stacked as needed. In this case, an available organic material may include copper phthalocyanine (CuPc), N'-Di(naphthalene-1-yl)-N, N'-diphenyl-benzidine (NPB), tris-8-hydroxyquinoline aluminum (Alq3), etc. When the intermediate layer 120 is formed of the polymeric organic material, an HTL may be included in addition to the intermediate layer 120. The HTL may be formed of poly-(2,4)-ethylene-dihydroxy thiophene (PEDOT) or polyaniline (PANI). In this case, an available organic material may include poly-phenylene vinylene-based and polyfluorene-based polymeric organic material.

The counter electrode 130 is formed on the intermediate layer 120 as a common electrode. Such a counter electrode 130 may be formed as a reflective electrode that is formed from a reflective material. The counter electrode 130 may include one or more materials selected from Ag, Al, Mg, Li, Ca, LiF/Ca, and LiF/Al. Since the counter electrode 130 is included as a reflective electrode, light emitted from the intermediate layer 120 is reflected by the counter electrode 130, penetrates the pixel electrode 108 including a transparent conductive material, and is emitted toward the substrate 10. Alternatively, the counter electrode 130 may be a (semi) transparent electrode. In the case of the (semi) transparent electrode, the counter electrode 130 may be formed of indium tin oxide (ITO), indium zinc oxide (IZO), zinc oxide (ZnO), indium oxide (In$_2$O$_3$), indium gallium oxide (IGO) or aluminum zinc oxide (AZO). Of course, the configuration and material of the counter electrode 130 are not limited thereto and other ones may be used.

For the capacitor area CA, the lower capacitor electrode 202 that is formed from the same material as the active layer 102 of the TFT, the upper capacitor electrode 208 that is formed from the same material as the pixel electrode 108, and the first insulating layer 13 that is disposed between the lower capacitor electrode 202 and the upper capacitor electrode 208 are formed on the substrate 10 and the buffer layer 11.

In this case, the second insulating layer 15 between the gate electrode 104 and the source electrode 106 and between the gate electrode 104 and the drain electrode 107 of the TFT is not formed between the upper capacitor electrode 208 and the lower capacitor electrode 202. In some embodiments, the third insulating layer 17 between the pixel electrode 108 and the source electrode 106 and between the pixel electrode 108 and the drain electrode 107 of the TFT is not formed between the upper capacitor electrode 208 and the lower capacitor electrode 202 either. That is, as described above, only the first insulating layer 13 may be formed between the upper capacitor electrode 208 and the lower capacitor electrode 202.

Although the second insulating layer 15 functioning as the interlayer insulating film of the TFT is designed to have a thickness over a certain value in consideration of the characteristics of the TFT, it is possible to increase capacitance if a insulating film is formed to have the same thickness as the interlayer insulating film, because the capacitor decreases in capacitance as the thickness of the insulating film increases.

However, according to the organic light-emitting display apparatus 2 according to the embodiment, the second insulating layer 15 is not disposed between electrodes of the capacitor, and the first insulating layer 13 disposed between the electrodes of the capacitor may be formed to have a thickness that is as small as that of a gate insulating film. Thus, it is possible to effectively prevent a decrease in the capacitance of the capacitor.

FIGS. 10 and 11 are schematic cross-sectional views of TFT substrates 10 according to other embodiments of the present disclosure. As shown in FIG. 10, on the capacitor area CA, the connection layer 204 arranged on the first insulating layer 13 may be arranged to face a part of the lower capacitor electrode 202. Subsequently, as shown in FIG. 11, the connection section 204-1 is formed on the first insulating layer 13 through the simultaneous etching process of the temporary layer 206 and the connection layer 204.

As previously described, the upper capacitor electrode 208 may be in contact with the internal side 204a of the connection section 204-1, and the connection section 204-1 may be a part of interconnections for transferring an electrical signal to the capacitor. Thus, as in FIGS. 1 to 8, the connection section 204-1 may remain on the whole surface of the connection opening 204b or as in FIGS. 10 and 11, the connection section 204-1 may remain on one side of the connection opening 204b.

While this invention has been described in connection with what are presently considered to be practical exemplary embodiments, it will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Thus, while the present disclosure has described certain exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a thin film transistor (TFT) substrate, the method comprising:
    forming a semiconductor layer on a substrate;
    patterning the semiconductor layer into an active layer and a lower capacitor electrode;
    forming a first insulating layer to cover the active layer and the lower capacitor electrode;
    forming a gate electrode of a TFT and a connection layer of a capacitor on the first insulating layer;
    forming a second insulating layer having an opening through which a source area and a drain area of the active layer and the connection layer are exposed;
    forming an temporary layer on the connection layer, a source electrode, and a drain electrode;
    forming a third insulating layer having an opening through which a part of the source electrode and the temporary layer are exposed;
    removing a part of the connection layer and the temporary layer; and
    forming a pixel electrode electrically connected to one of the source electrode and the drain electrode, and an upper capacitor electrode corresponding to the lower capacitor electrode, the pixel electrode and the upper capacitor electrode formed on the third insulating layer.

2. The method of claim 1, wherein the forming of the second insulating layer comprises forming the second insulating layer having an opening through which the central part of the top of the connection layer is exposed.

3. The method of claim 1, wherein the forming of the third insulating layer comprises forming the third insulating layer having an opening through which the whole top part of the temporary layer is exposed.

4. The method of claim 1, further comprising doping the lower capacitor electrode with an ionic impurity after removing the temporary layer.

5. The method of claim 1, wherein the pixel electrode and the upper capacitor electrode are formed simultaneously.

6. The method of claim 1, wherein the forming of the upper capacitor electrode comprises forming the upper capacitor electrode such that it is in contact with the connection layer.

7. The method of claim 6, wherein the forming of the upper capacitor electrode comprises forming the upper capacitor electrode to face the lower capacitor electrode and to be in contact with internal sides of the opening of the second insulating layer and the opening of the third insulating layer.

8. The method of claim 7, wherein the pixel electrode and the upper capacitor electrode are formed simultaneously.

9. The method of claim 1, wherein the forming of the capacitor comprises forming the connection layer to face a part of the lower capacitor electrode.

* * * * *